(12) United States Patent
Bae et al.

(10) Patent No.: US 12,408,350 B2
(45) Date of Patent: Sep. 2, 2025

(54) SEMICONDUCTOR DEVICES HAVING UPPERMOST INTERCONNECTION LINES PROTRUDING BEYOND TOP SURFACE OF LOWER INSULATING LAYER ON CELL REGION

(71) Applicant: SAMSUNG ELECTRONICS CO., LTD., Suwon-si (KR)

(72) Inventors: Byoungjae Bae, Hwaseong-si (KR); Shin Kwon, Yongin-si (KR); Jeongmin Park, Hwaseong-si (KR); Manjin Eom, Hwaseong-si (KR); Hyungjong Jeong, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 471 days.

(21) Appl. No.: 17/862,831

(22) Filed: Jul. 12, 2022

(65) Prior Publication Data
US 2023/0139618 A1    May 4, 2023

(30) Foreign Application Priority Data
Nov. 3, 2021    (KR) .................. 10-2021-0150036

(51) Int. Cl.
*H10B 61/00* (2023.01)
*H10N 50/01* (2023.01)
*H10N 50/80* (2023.01)

(52) U.S. Cl.
CPC ............. *H10B 61/00* (2023.02); *H10N 50/01* (2023.02); *H10N 50/80* (2023.02)

(58) Field of Classification Search
CPC ........ H10B 61/00; H10B 61/10; H10B 61/22; H10B 63/84; H10B 63/20; H10B 63/845;
(Continued)

(56) References Cited

U.S. PATENT DOCUMENTS 8,865,481 B2    10/2014  Li et al.
9,041,146 B2 *  5/2015   Lee ..................... G11C 11/161
                                                 257/E29.167
(Continued)

FOREIGN PATENT DOCUMENTS

DE    102019114280 A1 *  4/2020  ......... H01L 23/5226
KR    1019980065375 A    10/1998
(Continued)

*Primary Examiner* — Davienne N Monbleau
*Assistant Examiner* — Heim Kirin Grewal
(74) *Attorney, Agent, or Firm* — Muir Patent Law, PLLC

(57) ABSTRACT

A semiconductor device includes a substrate including a cell region and a peripheral region, interconnection lines on the cell region and the peripheral region, the interconnection lines being spaced apart from the substrate in a first direction perpendicular to a top surface of the substrate, a lower insulating layer on the cell region and the peripheral region, the lower insulating layer covering the interconnection lines, and a top surface of the lower insulating layer on the cell region being at a lower height than top surfaces of uppermost interconnection lines of the interconnection lines, and data storage patterns on the lower insulating layer on the cell region, the data storage patterns being horizontally spaced apart from each other, and the data storage patterns being connected directly to the top surfaces of the uppermost interconnection lines on the cell region.

18 Claims, 9 Drawing Sheets

(58) Field of Classification Search
CPC ........ H10B 63/10; H10B 63/80; H10B 53/30; H10N 50/01; H10N 50/10; H10N 50/80; H10N 70/20; H10N 70/011; H10N 70/821; H10N 79/00; G11C 11/161; H01L 21/823475; H01L 23/5283; H01L 23/5386
See application file for complete search history.

(56) References Cited

U.S. PATENT DOCUMENTS

| | | | |
|---|---|---|---|
| 9,595,662 B2 | 3/2017 | Li et al. | |
| 9,997,563 B2 | 6/2018 | Lee et al. | |
| 10,566,385 B2 | 2/2020 | Lee et al. | |
| 10,636,963 B2 | 4/2020 | Dai et al. | |
| 10,644,064 B2 | 5/2020 | Lee et al. | |
| 10,665,636 B2 | 5/2020 | Lin | |
| 11,683,992 B2 * | 6/2023 | Jeong | H10N 50/10 257/427 |
| 2018/0159023 A1 * | 6/2018 | Suh | H10N 50/80 |
| 2019/0081233 A1 * | 3/2019 | Lee | H10N 50/10 |
| 2019/0148633 A1 * | 5/2019 | Dai | H10N 50/85 257/421 |
| 2020/0020847 A1 * | 1/2020 | Lee | H10N 50/01 |
| 2020/0403145 A1 * | 12/2020 | Kim | H10N 50/01 |
| 2021/0104660 A1 * | 4/2021 | Dutta | H10N 50/01 |
| 2021/0135092 A1 * | 5/2021 | Wang | H10B 61/00 |
| 2021/0159272 A1 * | 5/2021 | Cho | H10B 61/22 |
| 2021/0296397 A1 * | 9/2021 | Ko | H10B 63/80 |
| 2022/0254990 A1 * | 8/2022 | Ryu | H10N 50/01 |
| 2022/0406996 A1 * | 12/2022 | Kuo | H10B 61/22 |
| 2024/0074208 A1 * | 2/2024 | Bae | H10B 61/22 |
| 2024/0081083 A1 * | 3/2024 | Kim | H10N 50/10 |

FOREIGN PATENT DOCUMENTS

| | | |
|---|---|---|
| KR | 1020180086375 A | 7/2018 |
| KR | 1020210117395 A | 9/2021 |

* cited by examiner

SEMICONDUCTOR DEVICES HAVING UPPERMOST INTERCONNECTION LINES PROTRUDING BEYOND TOP SURFACE OF LOWER INSULATING LAYER ON CELL REGION

CROSS-REFERENCE TO RELATED APPLICATION

This U.S. non-provisional patent application claims priority under 35 U.S.C. § 119 to Korean Patent Application No. 10-2021-0150036, filed on Nov. 3, 2021, in the Korean Intellectual Property Office, the entire contents of which are hereby incorporated by reference.

BACKGROUND

1. Field

The present disclosure relates to a semiconductor device and a method of manufacturing the same, and more particularly, to a semiconductor device including a magnetic tunnel junction and a method of manufacturing the same.

2. Description of the Related Art

As high-speed and/or low power consumption electronic devices have been demanded, high-speed and/or low-voltage semiconductor memory devices used therein have also been demanded. Magnetic memory devices have been developed as semiconductor memory devices capable of satisfying these demands. The magnetic memory devices may emerge as next-generation semiconductor memory devices because of their high-speed and/or non-volatile characteristics.

In general, a magnetic memory device may include a magnetic tunnel junction (MTJ) pattern. The MTJ pattern may include two magnetic layers and an insulating layer disposed between the two magnetic layers. A resistance value of the MTJ pattern may be changed depending on magnetization directions of the two magnetic layers. For example, the MTJ pattern may have a relatively high resistance value when the magnetization directions of the two magnetic layers are antiparallel to each other, and the MTJ pattern may have a relatively low resistance value when the magnetization directions of the two magnetic layers are parallel to each other. The magnetic memory device may write/read data using a difference between the resistance values of the MTJ pattern. A semiconductor device having an embedded structure in which a MTJ pattern is disposed between metal interconnection lines has been variously studied to satisfy various demands of an electronic industry.

SUMMARY

In an aspect, a semiconductor device may include a substrate having a cell region and a peripheral region, interconnection lines disposed on the cell region and the peripheral region and spaced apart from the substrate in a first direction perpendicular to a top surface of the substrate, a lower insulating layer disposed on the cell region and the peripheral region and covering the interconnection lines, and data storage patterns horizontally spaced apart from each other on the lower insulating layer on the cell region. A top surface of the lower insulating layer on the cell region may be located at a lower height than top surfaces of uppermost interconnection lines of the interconnection lines. The data storage patterns may be connected directly to the top surfaces of the uppermost interconnection lines on the cell region.

In an aspect, a semiconductor device may include a substrate having a cell region and a peripheral region, interconnection lines disposed on the cell region and the peripheral region and spaced apart from a top surface of the substrate in a first direction perpendicular to the top surface of the substrate, a lower insulating layer disposed on the cell region and the peripheral region and covering the interconnection lines, data storage patterns horizontally spaced apart from each other on the lower insulating layer on the cell region, and an etch stop layer and a first upper insulating layer which are sequentially stacked on the lower insulating layer on the peripheral region. The data storage patterns may be horizontally spaced apart from side surfaces of the etch stop layer and the first upper insulating layer. A top surface of the lower insulating layer on the cell region may be located at a lower height than a top surface of the lower insulating layer on the peripheral region.

BRIEF DESCRIPTION OF THE DRAWINGS

Features will become apparent to those of skill in the art by describing in detail exemplary embodiments with reference to the attached drawings, in which.

DETAILED DESCRIPTION

Example embodiments will now be described more fully with reference to the accompanying drawings.

Figure 1:
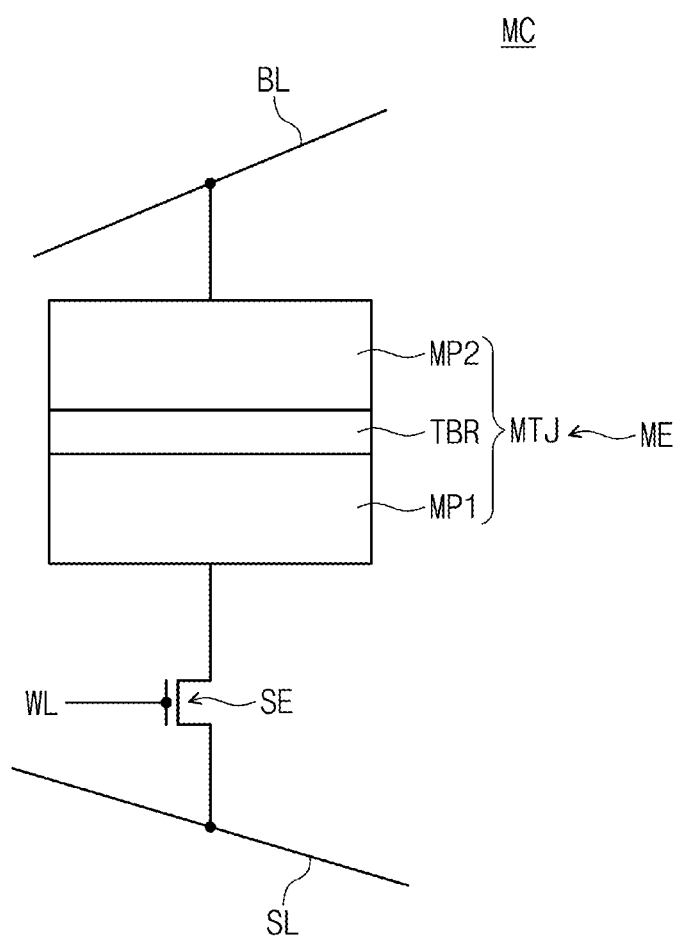
FIG. 1 is a circuit diagram illustrating a unit memory cell of a semiconductor device according to some embodiments.

FIG. 1 is a circuit diagram illustrating a unit memory cell of a semiconductor device according to some embodiments.

Referring to FIG. 1, a unit memory cell MC may include a memory element ME and a selection element SE. The memory element ME and the selection element SE may be electrically connected in series to each other. The memory element ME may be connected between a bit line BL and the selection element SE. The selection element SE may be connected between the memory element ME and a source line SL, and may be controlled by a word line WL. For example, the selection element SE may include a bipolar transistor or a metal-oxide-silicon (MOS) field effect transistor.

The memory element ME may include a magnetic tunnel junction pattern MTJ including magnetic patterns MP1 and MP2 spaced apart from each other and a tunnel barrier pattern TBR between the magnetic patterns MP1 and MP2. One of the magnetic patterns MP1 and MP2 may be a reference magnetic pattern of which a magnetization direction is fixed in one direction regardless of an external magnetic field under a general use environment. The other of the magnetic patterns MP1 and MP2 may be a free magnetic pattern of which a magnetization direction is changeable between two stable magnetization directions by an external magnetic field. An electrical resistance of the magnetic tunnel junction pattern MTJ when the magnetization directions of the reference and free magnetic patterns are anti-parallel to each other may be much greater than that of the magnetic tunnel junction pattern MTJ when the magnetization directions of the reference and free magnetic patterns are parallel to each other. In other words, the electrical resistance of the magnetic tunnel junction pattern MTJ may be adjusted by changing the magnetization direction of the free magnetic pattern. Thus, logical data may be stored in the memory element ME of the unit memory cell MC by using an electrical resistance difference according to the magnetization directions of the reference and free magnetic patterns.

Figure 2:
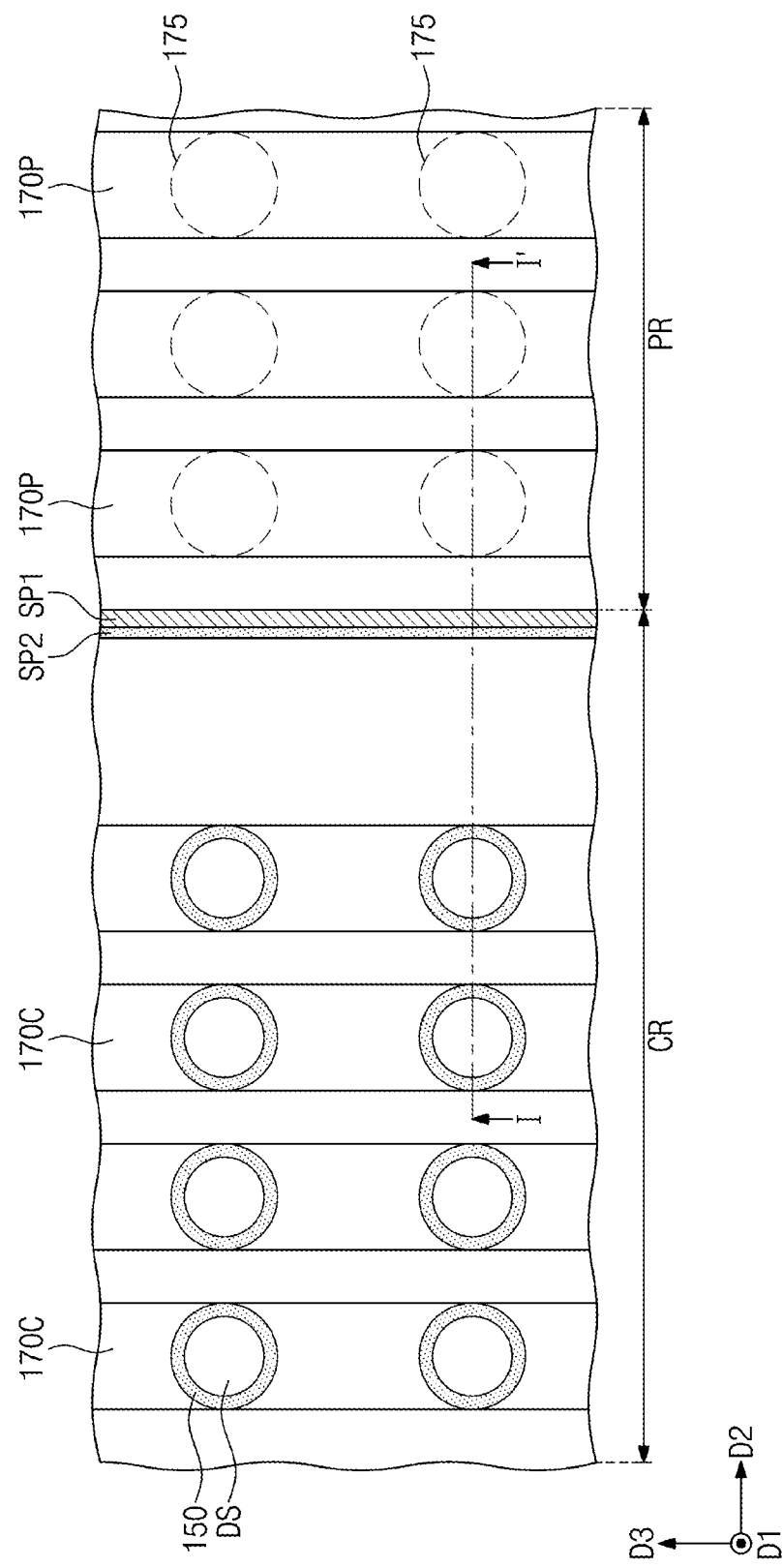
FIG. 2 is a plan view illustrating a semiconductor device according to some embodiments.
Figure 3:
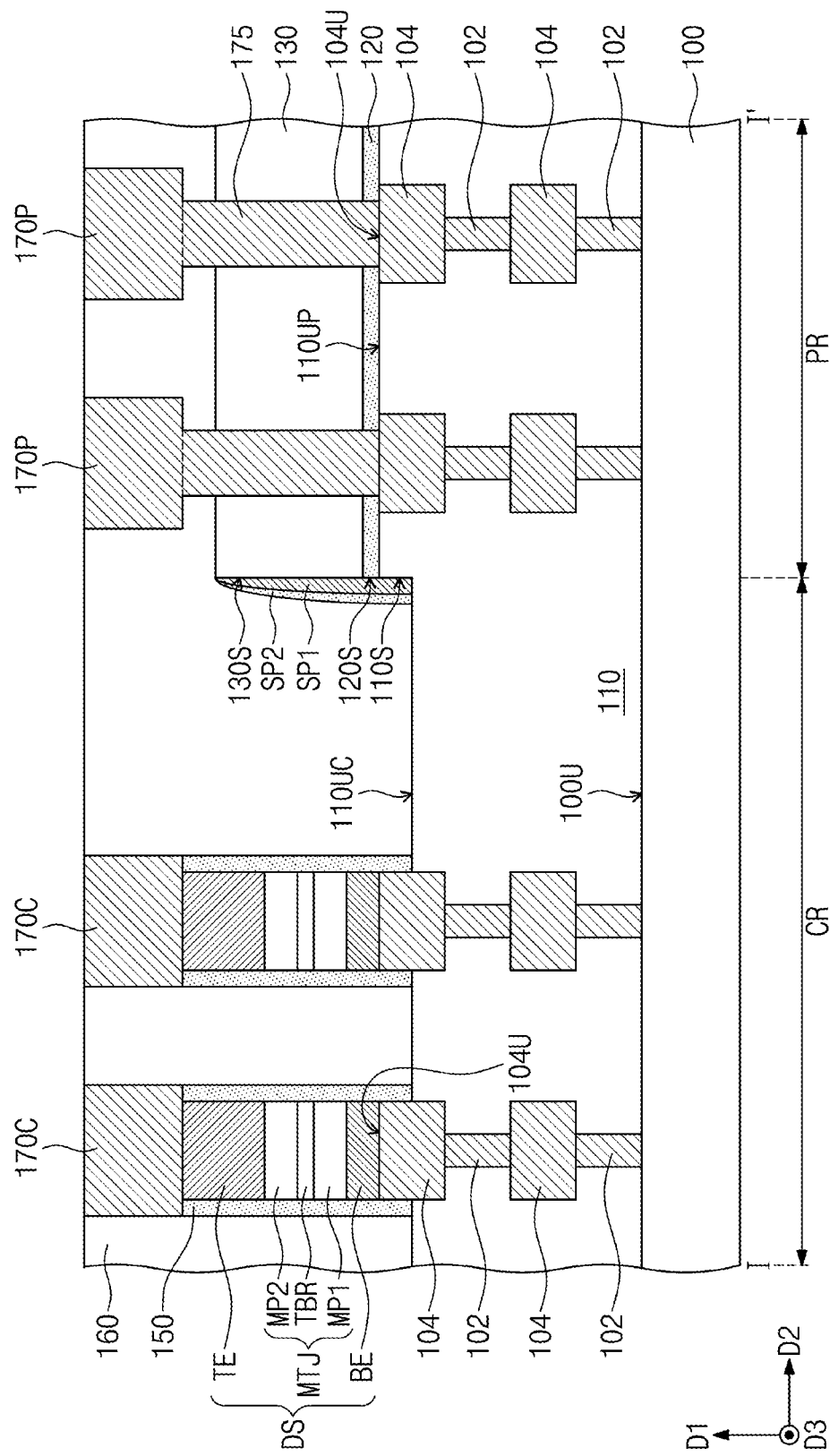
FIG. 3 is a cross-sectional view taken along a line I-I' of FIG. 2.
Figure 4A:
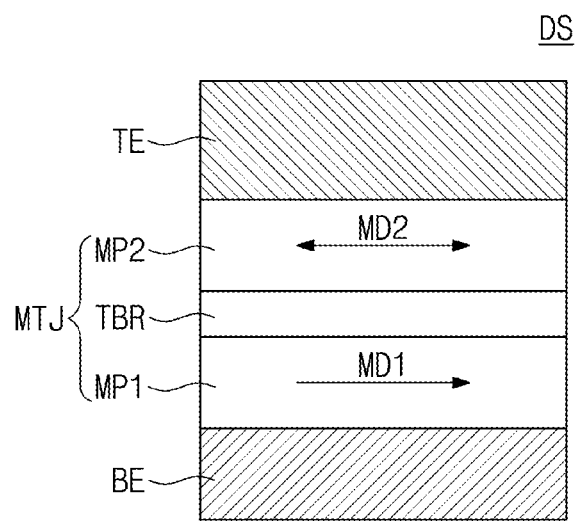
FIGS. 4A and 4B are cross-sectional views illustrating examples of a magnetic tunnel junction pattern of a semiconductor device according to some embodiments.
Figure 4B:
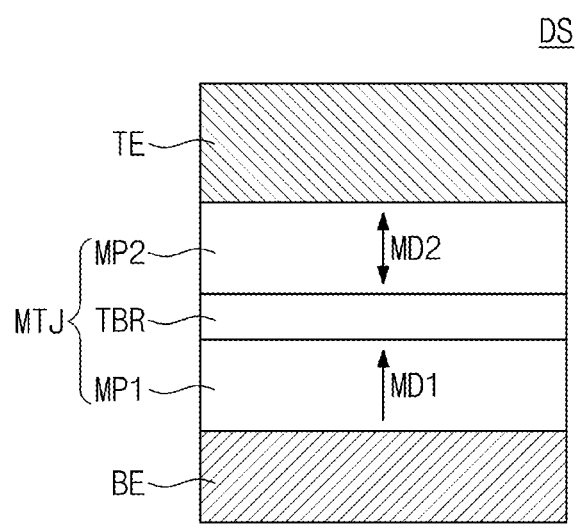

FIG. 2 is a plan view illustrating a semiconductor device according to some embodiments. FIG. 3 is a cross-sectional view taken along line I-I' of FIG. 2. FIGS. 4A and 4B are cross-sectional views illustrating examples of a magnetic tunnel junction pattern of a semiconductor device according to some embodiments.

Referring to FIGS. 2 and 3, a substrate 100 including a cell region CR and a peripheral region PR may be provided. The substrate 100 may be a semiconductor substrate including, e.g., silicon (Si), silicon-on-insulator (SOI), silicon-germanium (SiGe), germanium (Ge), or gallium-arsenic (GaAs). The cell region CR may be a region of the substrate 100, on which the memory cells MC of FIG. 1 are provided, and the peripheral region PR may be another region of the substrate 100, on which logic circuits are provided.

An interconnection structure 102 and 104 may be disposed on the cell region CR and the peripheral region PR of the substrate 100. The interconnection structure 102 and 104 may include interconnection lines 104 vertically spaced apart from the substrate 100, and interconnection contacts 102 connected to the interconnection lines 104. The interconnection lines 104 may be disposed on the cell region CR and the peripheral region PR of the substrate 100, and may be spaced apart from the substrate 100 in a first direction D1 perpendicular to a top surface 100U of the substrate 100. The interconnection contacts 102 may be disposed on the cell region CR and the peripheral region PR of the substrate 100, and may be disposed between the substrate 100 and the interconnection lines 104. Each of the interconnection lines 104 may be electrically connected to the substrate 100 through a corresponding one of the interconnection contacts 102. The interconnection lines 104 and the interconnection contacts 102 may include a metal (e.g., copper). For example, as illustrated in FIG. 3, a plurality of interconnection contacts 102 and a plurality of interconnection lines 104 may be alternately and repeatedly stacked on top of each other along the first direction D1.

The selection elements SE described with reference to FIG. 1 may be disposed in, e.g., within or inside, the substrate 100. The selection elements may be, e.g., field effect transistors. Each of the interconnection lines 104 may be electrically connected to one terminal (e.g., a source/drain terminal or a gate terminal) of a corresponding one of the selection elements (within the substrate 100) through a corresponding one of the interconnection contacts 102. For example, as illustrated in FIG. 3, each stack of alternating interconnection lines 104 and interconnection contacts 102 may be electrically connected to one terminal (e.g., a source/drain terminal or a gate terminal) of a corresponding one of the selection elements through a corresponding one of the interconnection contacts 102.

A lower insulating layer 110 may be disposed on the cell region CR and the peripheral region PR of the substrate 100 to cover the interconnection structure 102 and 104. The lower insulating layer 110 may expose top surfaces 104U of uppermost interconnection lines 104 of the interconnection lines 104. The top surfaces 104U of the uppermost interconnection lines 104 on the cell region CR may be located at substantially the same height as the top surfaces 104U of the uppermost interconnection lines 104 on the peripheral region PR. In the present specification, the term 'height' may mean a distance measured from the top surface 100U of the substrate 100 in the first direction D1.

The lower insulating layer 110 on the cell region CR may expose the top surfaces 104U and, e.g., at least portions of, side surfaces of the uppermost interconnection lines 104 on the cell region CR. A top surface 110UC of the lower insulating layer 110 on the cell region CR may be located at a lower height than the top surfaces 104U of the uppermost interconnection lines 104 on the cell region CR. The lower insulating layer 110 on the peripheral region PR may expose the top surfaces 104U of the uppermost interconnection lines 104 on the peripheral region PR. A top surface 110UP of the lower insulating layer 110 on the peripheral region PR may be substantially coplanar with the top surfaces 104U of the uppermost interconnection lines 104 on the peripheral region PR and may be located at substantially the same height as the top surfaces 104U of the uppermost interconnection lines 104 on the peripheral region PR. The top surface 110UC of the lower insulating layer 110 on the cell region CR may be located at a lower height than the top surface 110UP of the lower insulating layer 110 on the peripheral region PR. For example, the lower insulating layer 110 may include silicon oxide, silicon nitride, and/or silicon oxynitride.

A data storage pattern DS may be disposed on the cell region CR of the substrate 100. The data storage pattern DS may be provided in plurality, and the plurality of data storage patterns DS may be spaced apart from each other in a second direction D2 and a third direction D3 which are parallel to the top surface 100U of the substrate 100 and intersect each other. The plurality of data storage patterns DS may be connected directly to the top surfaces 104U of the uppermost interconnection lines 104 on the cell region CR. Each of the plurality of data storage patterns DS may be disposed on the top surface 104U of a corresponding uppermost interconnection line 104 of the uppermost interconnection lines 104 on the cell region CR and may be in direct contact with the top surface 104U of the corresponding uppermost interconnection line 104.

The data storage pattern DS may include a lower electrode BE, a magnetic tunnel junction pattern MTJ, and an upper electrode TE, which are sequentially stacked on the top surface 104U of a corresponding uppermost interconnection line 104 of the uppermost interconnection lines 104 on the cell region CR. The lower electrode BE may be disposed between the top surface 104U of the corresponding uppermost interconnection line 104 and the magnetic tunnel junction pattern MTJ, and the magnetic tunnel junction pattern MTJ may be disposed between the lower electrode BE and the upper electrode TE. The lower electrode BE may be in direct contact with the top surface 104U of the corresponding uppermost interconnection line 104. The magnetic tunnel junction pattern MTJ may include the first magnetic pattern MP1, the second magnetic pattern MP2, and the tunnel barrier pattern TBR between the first and second magnetic patterns MP1 and MP2. The first magnetic pattern MP1 may be disposed between the lower electrode BE and the tunnel barrier pattern TBR, and the second magnetic pattern MP2 may be disposed between the upper electrode TE and the tunnel barrier pattern TBR. For example, the lower electrode BE may include a conductive metal nitride (e.g., titanium nitride or tantalum nitride). The upper electrode TE may include at least one of a metal (e.g., Ta, W, Ru, or Ir) or a conductive metal nitride (e.g., TiN).

Referring to FIGS. 4A and 4B, the first magnetic pattern MP1 may be a reference layer having a magnetization direction MD1 fixed in one direction, and the second magnetic pattern MP2 may be a free layer having a magnetization direction MD2 changeable to be parallel or antiparallel to the magnetization direction MD1 of the first magnetic pattern MP1. FIGS. 4A and 4B illustrate examples in which the second magnetic pattern MP2 is the free layer, but embodiments are not limited thereto. Unlike FIGS. 4A and 4B, the first magnetic pattern MP1 may be the free layer, and the second magnetic pattern MP2 may be the reference layer.

Referring to FIG. 4A, in some examples, the magnetization directions MD1 and MD2 of the first magnetic pattern MP1 and the second magnetic pattern MP2 may be parallel to an interface of the tunnel barrier pattern TBR and the second magnetic pattern MP2. In this case, each of the first magnetic pattern MP1 and the second magnetic pattern MP2 may include a ferromagnetic material. The first magnetic pattern MP1 may further include an antiferromagnetic material for pinning a magnetization direction of the ferromagnetic material in the first magnetic pattern MP1.

Referring to FIG. 4B, in other examples, the magnetization directions MD1 and MD2 of the first magnetic pattern MP1 and the second magnetic pattern MP2 may be substantially perpendicular to the interface of the tunnel barrier pattern TBR and the second magnetic pattern MP2. In this case, each of the first and second magnetic patterns MP1 and MP2 may include at least one of an intrinsic perpendicular magnetic material or an extrinsic perpendicular magnetic material. The intrinsic perpendicular magnetic material may include a material which has a perpendicular magnetization property even though an external factor does not exist. The intrinsic perpendicular magnetic material may include at least one of a perpendicular magnetic material (e.g., CoFeTb, CoFeGd, or CoFeDy), a perpendicular magnetic material having a $L1_0$ structure, a CoPt alloy having a hexagonal close packed (HCP) lattice structure, or a perpendicular magnetic structure. The perpendicular magnetic material having the $L1_0$ structure may include at least one of FePt having the $L1_0$ structure, FePd having the $L1_0$ structure, CoPd having the $L1_0$ structure, or CoPt having the $L1_0$ structure. The perpendicular magnetic structure may include magnetic layers and non-magnetic layers, which are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where 'n' denotes the number of bilayers. The extrinsic perpendicular magnetic material may include a material which has an intrinsic horizontal magnetization property but has a perpendicular magnetization property by an external factor. For example, the extrinsic perpendicular magnetic material may have the perpendicular magnetization property due to magnetic anisotropy induced by a junction of the first magnetic pattern MP1 (or the second magnetic pattern MP2) and the tunnel barrier pattern TBR. The extrinsic perpendicular magnetic material may include, e.g., CoFeB.

For example, each of the first magnetic pattern MP1 and the second magnetic pattern MP2 may include a Co-based Heusler alloy. The tunnel barrier pattern TBR may include at least one of a magnesium (Mg) oxide layer, a titanium (Ti) oxide layer, an aluminum (Al) oxide layer, a magnesium-zinc (Mg—Zn) oxide layer, or a magnesium-boron (Mg—B) oxide layer.

Referring again to FIGS. 2 and 3, an insulating spacer 150 may be disposed on the cell region CR of the substrate 100 and, e.g., directly, on a side surface of the data storage pattern DS. The insulating spacer 150 may surround the side surface of the data storage pattern DS when viewed in a plan view, e.g., the insulating spacer 150 may surround an entire perimeter of the data storage pattern DS in a plan view. The insulating spacer 150 may, e.g., continuously and completely, cover side surfaces of the lower electrode BE, of the magnetic tunnel junction pattern MTJ, and of the upper electrode TE, and may surround the side surfaces of the lower electrode BE, the magnetic tunnel junction pattern MTJ and the upper electrode TE when viewed in a plan view. The lower insulating layer 110 on the cell region CR may, e.g., at least partially, expose the side surfaces of the uppermost interconnection lines 104. The insulating spacer 150 may extend onto the exposed side surface of a corresponding uppermost interconnection line 104 of the uppermost interconnection lines 104. The insulating spacer 150 may cover the exposed side surface of the corresponding uppermost interconnection line 104, and a bottommost surface of the insulating spacer 150 may be in, e.g., direct, contact with the top surface 110UC of the lower insulating layer 110 on the cell region CR. The insulating spacer 150 may include a nitride (e.g., silicon nitride).

An etch stop layer 120 and a first upper insulating layer 130 may be disposed on the peripheral region PR of the substrate 100, and may be sequentially stacked, e.g., directly, on the lower insulating layer 110 on the peripheral region PR. The etch stop layer 120 may cover the top surface 110UP of the lower insulating layer 110 on the peripheral region PR and the top surfaces 104U of the uppermost interconnection lines 104 on the peripheral region PR. The etch stop layer 120 may be disposed between the first upper insulating layer 130 and the top surface 110UP of the lower insulating layer 110 on the peripheral region PR, and between the first upper insulating layer 130 and the top surfaces 104U of the uppermost interconnection lines 104 on the peripheral region PR. The etch stop layer 120 may include a material different from that of the first upper insulating layer 130. For example, the etch stop layer 120 may include at least one of silicon nitride (e.g., SiCN), silicon oxide, or a metal nitride (e.g., AlN). For example, the first upper insulating layer 130 may include silicon oxide, silicon nitride, and/or silicon oxynitride.

Since the top surface 110UC of the lower insulating layer 110 on the cell region CR is located at a lower height than the top surface 110UP of the lower insulating layer 110 on the peripheral region PR, a side surface 130S of the first upper insulating layer 130 and a side surface 120S of the etch stop layer 120 may be exposed, and a side surface 110S of the lower insulating layer 110 on the peripheral region PR may be exposed. For example, as illustrated in FIG. 3, the side surface 130S of the first upper insulating layer 130, the side surface 120S of the etch stop layer 120, and the side surface 110S of the lower insulating layer 110 may be coplanar with each other. The plurality of data storage patterns DS may be horizontally spaced apart, e.g., along the second direction D2, from the side surface 130S of the first upper insulating layer 130, the side surface 120S of the etch stop layer 120, and the side surface 110S of the lower insulating layer 110 on the peripheral region PR.

A first boundary spacer SP1 may be disposed on the side surface 130S of the first upper insulating layer 130 and may, e.g., continuously, extend along the side surface 130S of the first upper insulating layer 130. The first boundary spacer SP1 may cover the side surface 130S of the first upper insulating layer 130. The first boundary spacer SP1 may have a line shape elongated in the third direction D3 when viewed in a plan view. The first boundary spacer SP1 may, e.g., continuously, extend onto the side surface 120S of the etch stop layer 120 and the side surface 110S of the lower insulating layer 110 on the peripheral region PR, and may cover the side surface 120S of the etch stop layer 120 and the side surface 110S of the lower insulating layer 110 on the peripheral region PR. A bottommost surface of the first boundary spacer SP1 may be in, e.g., direct, contact with the top surface 110UC of the lower insulating layer 110 on the cell region CR.

The first boundary spacer SP1 may include the same material as at least one of the lower electrode BE or the magnetic tunnel junction pattern MTJ. The first boundary spacer SP1 may include the same element as an element of at least one of the lower electrode BE or the magnetic tunnel junction pattern MTJ. The first boundary spacer SP1 may include a conductive material.

A second boundary spacer SP2 may be disposed, e.g., directly, on a side surface of the first boundary spacer SP1. The first boundary spacer SP1 and the second boundary spacer SP2 may be sequentially stacked on the side surface 130S of the first upper insulating layer 130 and may extend along the side surface 130S of the first upper insulating layer 130. The first boundary spacer SP1 may be disposed between the side surface 130S of the first upper insulating layer 130 and the second boundary spacer SP2. The second boundary spacer SP2 may have a line shape elongated in the third direction D3 when viewed in a plan view. The second boundary spacer SP2 may, e.g., continuously, extend onto the side surface 120S of the etch stop layer 120 and the side surface 110S of the lower insulating layer 110 on the peripheral region PR. The first boundary spacer SP1 may extend between the side surface 120S of the etch stop layer 120 and the second boundary spacer SP2, and between the side surface 110S of the lower insulating layer 110 on the peripheral region PR and the second boundary spacer SP2. A bottommost surface of the second boundary spacer SP2 may be in, e.g., direct, contact with the top surface 110UC of the lower insulating layer 110 on the cell region CR.

The second boundary spacer SP2 may include an insulating material. The second boundary spacer SP2 may include the same material as the insulating spacer 150. In certain embodiments, the second boundary spacer SP2 may not be provided.

A second upper insulating layer 160 may be disposed on the cell region CR and the peripheral region PR of the substrate 100. The second upper insulating layer 160 may cover the plurality of data storage patterns DS and may fill a space between the plurality of data storage patterns DS. The second upper insulating layer 160 may cover the top surface 110UC of the lower insulating layer 110 on the cell region CR and may be in, e.g., direct, contact with the top surface 110UC of the lower insulating layer 110 on the cell region CR. The insulating spacer 150 may be disposed between the side surface of each of the plurality of data storage patterns DS and the second upper insulating layer 160, and may be disposed between the exposed side surface of a corresponding uppermost interconnection line 104 of the uppermost interconnection lines 104 and the second upper insulating layer 160.

The second upper insulating layer 160 may, e.g., completely, cover the first and second boundary spacers SP1 and SP2, and may extend onto a top surface of the first upper insulating layer 130. The first and second boundary spacers SP1 and SP2 may be disposed between the side surface 130S of the first upper insulating layer 130 and the second upper insulating layer 160, between the side surface 120S of the etch stop layer 120 and the second upper insulating layer 160, and between the side surface 110S of the lower insulating layer 110 on the peripheral region PR and the second upper insulating layer 160. For example, the second upper insulating layer 160 may include silicon oxide, silicon nitride, and/or silicon oxynitride.

Cell conductive lines 170C may be disposed on the cell region CR of the substrate 100 and in the second upper insulating layer 160. For example, the cell conductive lines 170C may be spaced apart from each other in the second direction D2 and may extend in the third direction D3. The cell conductive lines 170C may be disposed on the plurality of data storage patterns DS, and each of the cell conductive lines 170C may be connected onto data storage patterns DS, spaced apart from each other in the third direction D3, of the plurality of data storage patterns DS. For example, as illustrated in FIG. 2, data storage patterns DS that are spaced apart from each other in the third direction D3 may be connected to a same cell conductive line 170C, e.g., the same cell conductive line 170C may extend continuously to overlap data storage patterns DS that are spaced apart from each other in the third direction D3.

The data storage pattern DS may be disposed under a corresponding cell conductive line 170C of the cell conductive lines 170C. The upper electrode TE may be disposed between the magnetic tunnel junction pattern MTJ and the corresponding cell conductive line 170C, and may be connected to the corresponding cell conductive line 170C. The corresponding cell conductive line 170C may cover a top surface of the upper electrode TE and may cover, e.g., overlap, a topmost surface of the insulating spacer 150. The second upper insulating layer 160 may extend between, e.g., adjacent ones of, the cell conductive lines 170C and may cover side surfaces of the cell conductive lines 170C. The cell conductive lines 170C may function as the bit lines BL described with reference to FIG. 1.

Peripheral conductive lines 170P may be disposed on the peripheral region PR of the substrate 100 and in the second upper insulating layer 160. For example, the peripheral conductive lines 170P may be spaced apart from each other in the second direction D2 and may extend in the third direction D3. The second upper insulating layer 160 may extend between, e.g., adjacent ones of, the peripheral conductive lines 170P and may cover side surfaces of the peripheral conductive lines 170P. Peripheral contacts 175 may be disposed under each of the peripheral conductive lines 170P. The peripheral contacts 175 may be spaced apart from each other in the third direction D3 under each of the peripheral conductive lines 170P, and may be connected to each of the peripheral conductive lines 170P, e.g., peripheral contacts 175 that are spaced apart from each other in the third direction D3 may be connected to a same peripheral conductive line 170P. Each of the peripheral contacts 175 may penetrate the second upper insulating layer 160, the first upper insulating layer 130, and the etch stop layer 120, and may be connected (i.e., electrically connected) to a corresponding one of the uppermost interconnection lines 104.

The peripheral conductive lines 170P and the peripheral contacts 175 may include the same material. Each of the peripheral contacts 175 may be in contact with a corresponding peripheral conductive line 170P of the peripheral conductive lines 170P in one body without an interface therebetween, e.g., in a seamless and integrated one body. The cell conductive lines 170C may include the same material as the peripheral conductive lines 170P and the peripheral contacts 175. The cell conductive lines 170C, the peripheral conductive lines 170P, and the peripheral contacts 175 may include at least one of a metal (e.g., copper) or a conductive metal nitride.

According to embodiments, additional contact plugs for electrical connection between the plurality of data storage patterns DS and the uppermost interconnection lines 104 may not be required. Accordingly, a manufacturing process for forming the contact plugs may not be required, and thus the number of processes for manufacturing the semiconductor device may be reduced. As a result, the processes of manufacturing the semiconductor device may be simplified.

In addition, since the contact plugs are not formed between the plurality of data storage patterns DS and the uppermost interconnection lines 104, vertical lengths (e.g., lengths in the first direction D1) of the peripheral contacts 175 on the peripheral region PR may be reduced. Accordingly, an aspect ratio of the peripheral contacts 175 may be reduced, and thus the peripheral contacts 175 may be easily formed. As a result, the semiconductor device may be easily manufactured.

FIGS. 5 to 9 are cross-sectional views corresponding to line I-I' of FIG. 2 to illustrate stages in a method of manufacturing a semiconductor device according to some embodiments. Hereinafter, the descriptions to the same features as mentioned with reference to FIGS. 1-3, 4A, and 4B will be omitted for the purpose of ease and convenience in explanation.

Figure 5:
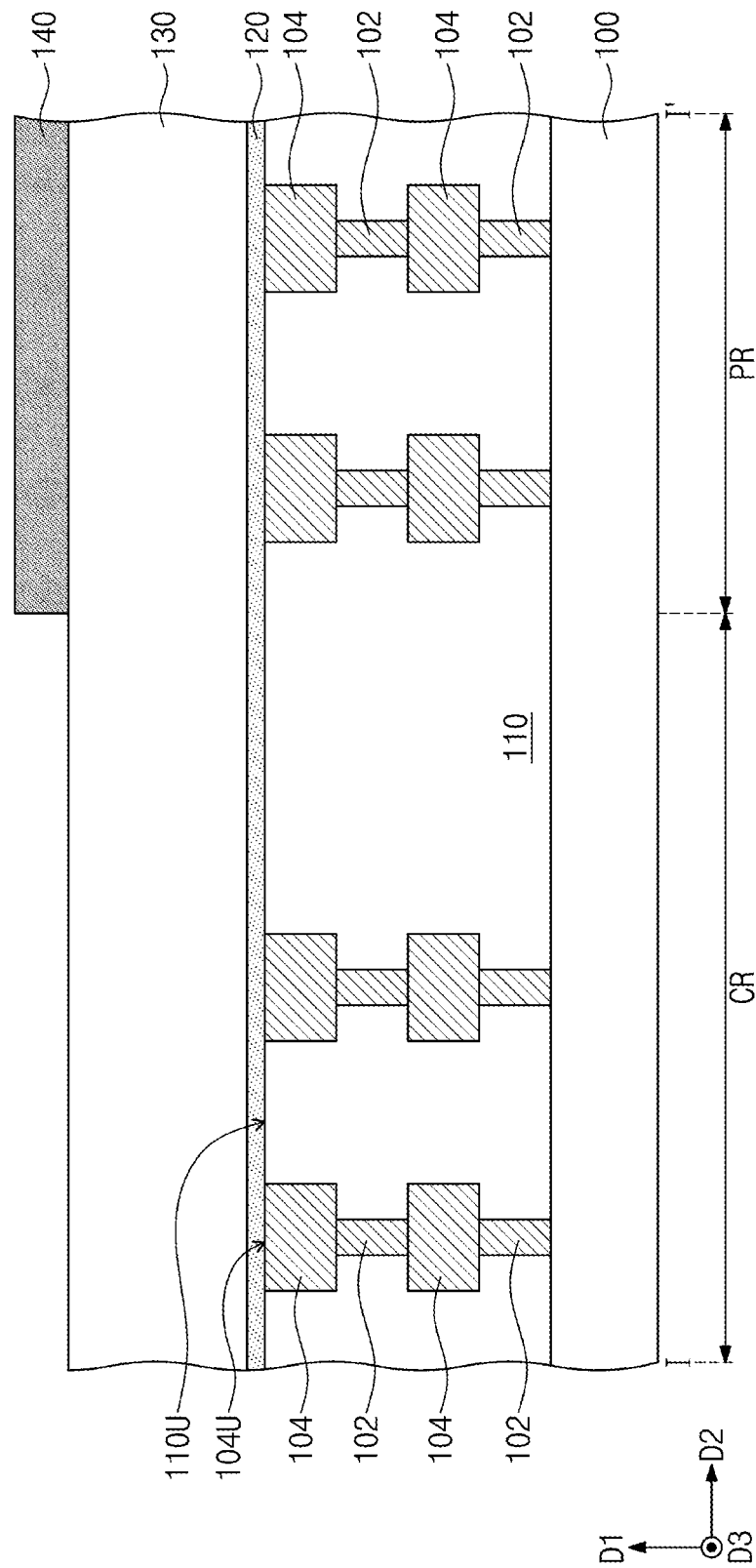
FIGS. 5 to 9 are cross-sectional views along line I-I' of FIG. 2 of stages in a method of manufacturing a semiconductor device according to some embodiments.

Referring to FIG. 5, the substrate 100 including the cell region CR and the peripheral region PR may be provided. The selection elements described with reference to FIG. 1 may be formed in the substrate 100. The interconnection structure 102 and 104 may be formed on the cell region CR and the peripheral region PR of the substrate 100. The interconnection structure 102 and 104 may include interconnection lines 104 and interconnection contacts 102 connected to the interconnection lines 104. Each of the interconnection lines 104 may be electrically connected to one terminal (e.g., a source/drain terminal or a gate terminal) of a corresponding one of the selection elements through a corresponding one of the interconnection contacts 102. The lower insulating layer 110 may be formed on the cell region CR and the peripheral region PR of the substrate 100, and may cover the interconnection structure 102 and 104. The lower insulating layer 110 may expose top surfaces 104U of uppermost interconnection lines 104 of the interconnection lines 104.

The etch stop layer 120 and the first upper insulating layer 130 may be sequentially stacked on the cell region CR and the peripheral region PR of the substrate 100 and on the lower insulating layer 110. The etch stop layer 120 may cover the top surface 110U of the lower insulating layer 110 and the top surfaces 104U of the uppermost interconnection lines 104. The etch stop layer 120 may be disposed between the top surface 110U of the lower insulating layer 110 and the first upper insulating layer 130, and between the top surfaces 104U of the uppermost interconnection lines 104 and the first upper insulating layer 130.

A peripheral mask pattern 140 may be formed on the peripheral region PR of the substrate 100 and on the first upper insulating layer 130. The peripheral mask pattern 140 may, e.g., completely, cover the first upper insulating layer 130 on the peripheral region PR, and may expose the first upper insulating layer 130 on the cell region CR. The peripheral mask pattern 140 may include a metal nitride (e.g., TiN).

Figure 6:
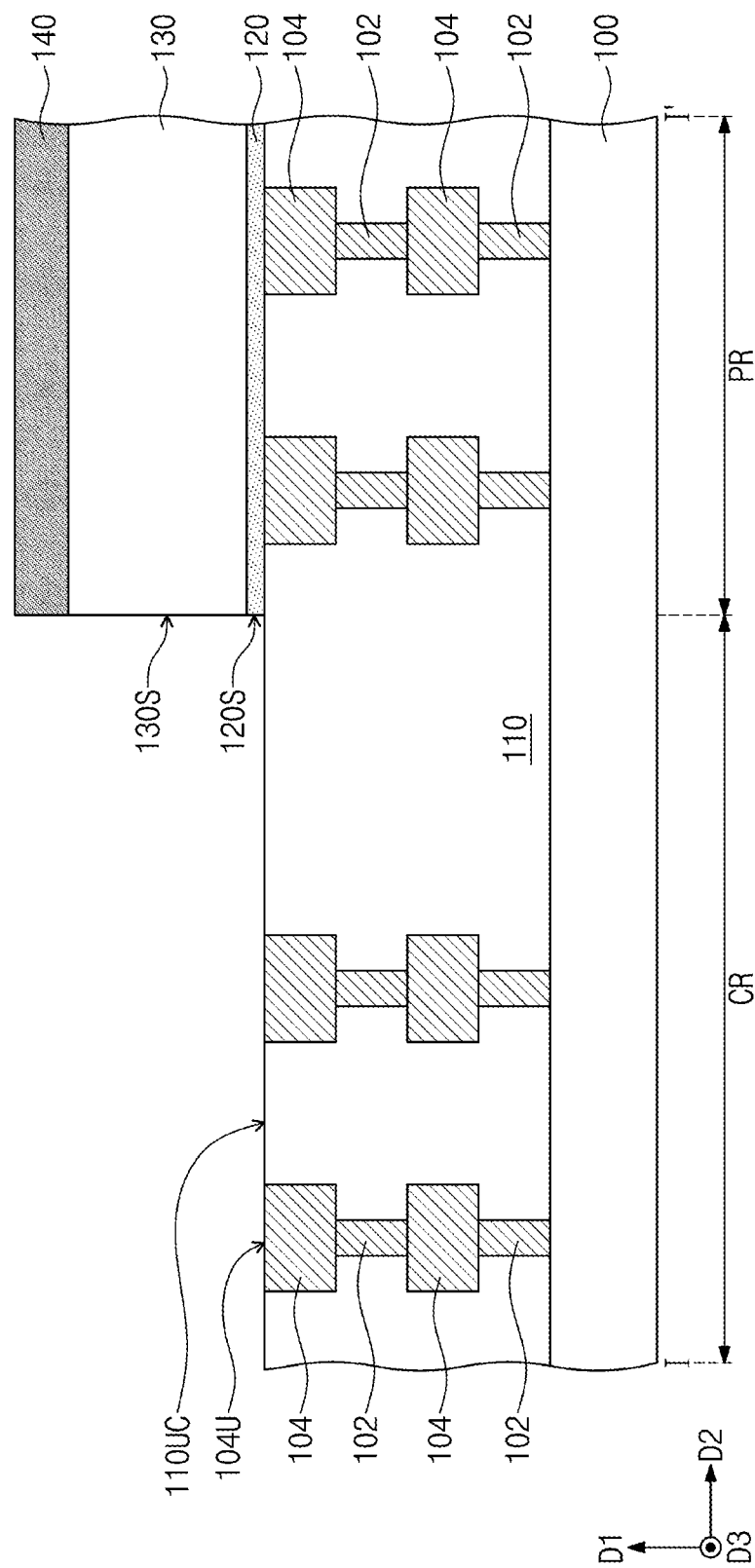

Referring to FIG. 6, an etching process using the peripheral mask pattern 140 as an etch mask may be performed, and the first upper insulating layer 130 on the cell region CR and the etch stop layer 120 on the cell region CR may be removed by the etching process. Thus, the top surfaces 104U of the uppermost interconnection lines 104 on the cell region CR and a top surface 110UC of the lower insulating layer 110 on the cell region CR may be exposed. The etching process may include a dry etching process and/or a wet etching process.

The first upper insulating layer 130 on the peripheral region PR and the etch stop layer 120 on the peripheral region PR may not be removed but may remain, during the etching process. The side surface 130S of the first upper insulating layer 130 on the peripheral region PR and the side surface 120S of the etch stop layer 120 on the peripheral region PR may be exposed by the etching process.

Figure 7:
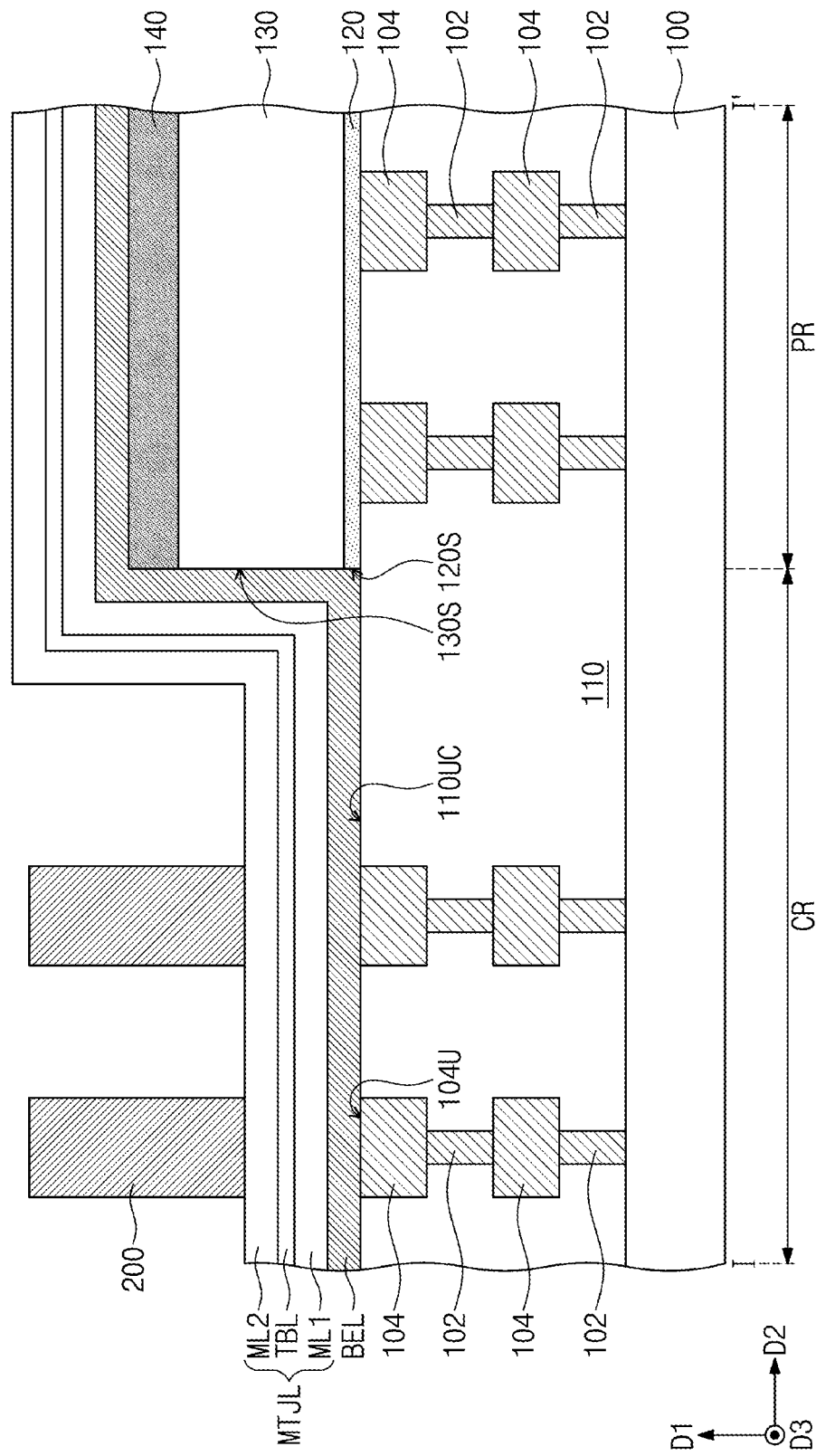

Referring to FIG. 7, a lower electrode layer BEL and a magnetic tunnel junction layer MTJL may be sequentially stacked on the cell region CR and the peripheral region PR of the substrate 100. The lower electrode layer BEL may, e.g., conformally, cover the top surfaces 104U of the uppermost interconnection lines 104 on the cell region CR and the top surface 110UC of the lower insulating layer 110 on the cell region CR. The lower electrode layer BEL may extend from the top surface 110UC of the lower insulating layer 110 on the cell region CR onto the side surface 120S of the etch stop layer 120 on the peripheral region PR, the side surface 130S of the first upper insulating layer 130 on the peripheral region PR, and a side surface of the peripheral mask pattern 140, and may cover the side surface 120S of the etch stop layer 120 on the peripheral region PR, the side surface 130S of the first upper insulating layer 130 on the peripheral region PR, and the side surface of the peripheral mask pattern 140. The lower electrode layer BEL may extend onto a top surface of the peripheral mask pattern 140 and may cover the top surface of the peripheral mask pattern 140. The magnetic tunnel junction layer MTJL may extend, e.g., conformally, from the cell region CR onto the peripheral region PR along a top surface of the lower electrode layer BEL.

The magnetic tunnel junction layer MTJL may include a first magnetic layer ML1, a tunnel barrier layer TBL, and a second magnetic layer ML2, which are sequentially stacked on the lower electrode layer BEL. The magnetic tunnel junction layer MTJL and the lower electrode layer BEL may be formed using, e.g., a sputtering process, a chemical vapor deposition (CVD) process, or an atomic layer deposition (ALD) process.

A conductive mask pattern 200 may be formed on the cell region CR of the substrate 100 and on the magnetic tunnel junction layer MTJL. The conductive mask pattern 200 may be provided in plurality, and the plurality of conductive mask patterns 200 may be spaced apart from each other in the second direction D2 and the third direction D3. The conductive mask pattern 200 may define a region in which the data storage pattern DS to be described later will be formed. For example, the conductive mask pattern 200 may include at least one of a metal (e.g., Ta, W, Ru, or Ir) or a conductive metal nitride (e.g., TiN).

Figure 8:
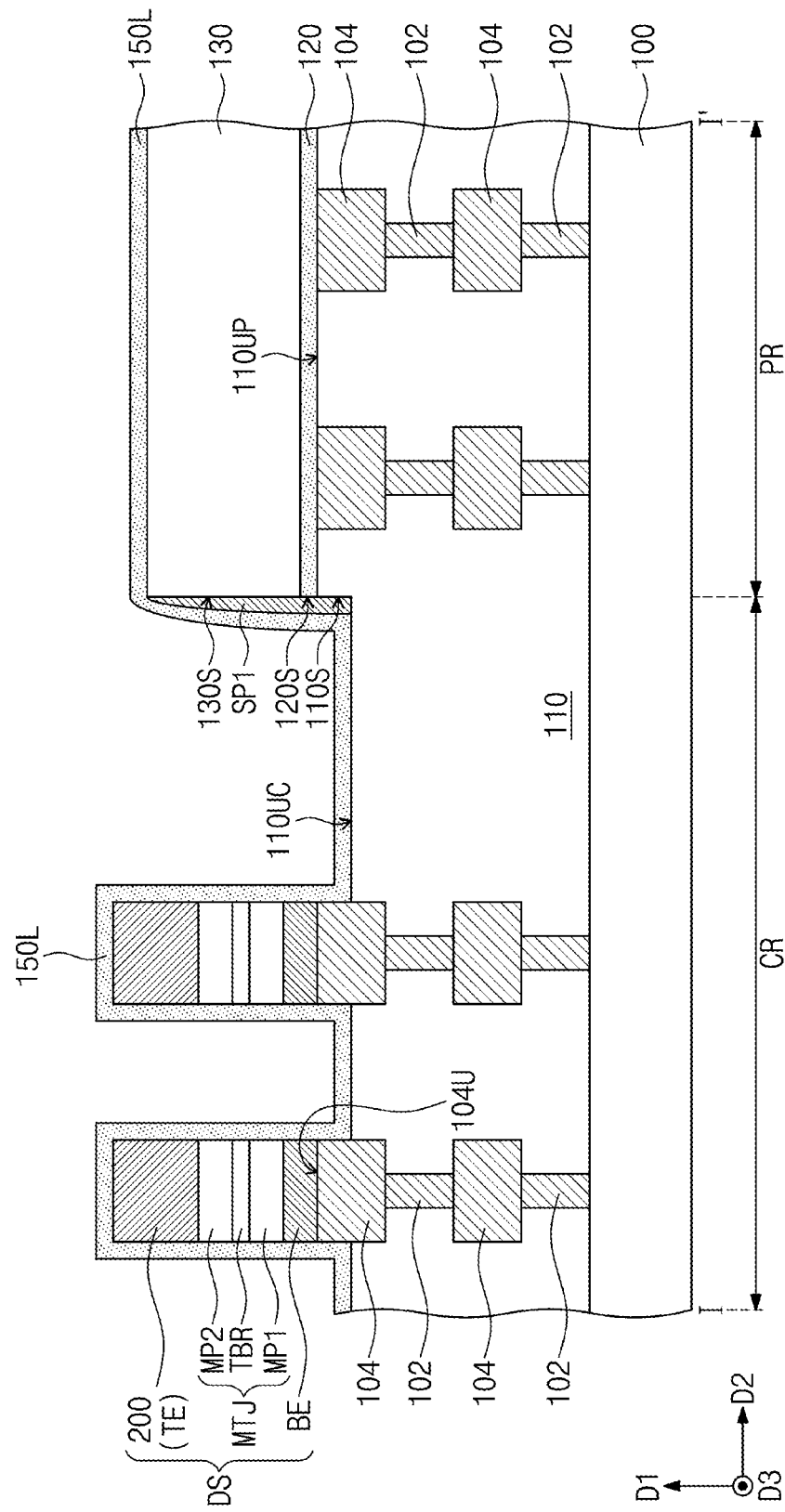

Referring to FIG. 8, the magnetic tunnel junction layer MTJL and the lower electrode layer BEL may be etched using the conductive mask pattern 200 as an etch mask. The etching of the magnetic tunnel junction layer MTJL and the lower electrode layer BEL may include performing an ion beam etching process using the conductive mask pattern 200 as the etch mask. A magnetic tunnel junction pattern MTJ and a lower electrode BE may be formed by the etching of the magnetic tunnel junction layer MTJL and the lower electrode layer BEL, respectively. The magnetic tunnel junction pattern MTJ may include the first magnetic pattern MP1, the tunnel barrier pattern TBR, and the second magnetic pattern MP2, which are sequentially stacked on the lower electrode BE. The second magnetic pattern MP2, the tunnel barrier pattern TBR, and the first magnetic pattern MP1 may be formed by sequentially etching the second magnetic layer ML2, the tunnel barrier layer TBL, and the first magnetic layer ML1 using the conductive mask pattern 200 as the etch mask, respectively. After the formation of the magnetic tunnel junction pattern MTJ and the lower electrode BE, a portion of the conductive mask pattern 200 may remain on the magnetic tunnel junction pattern MTJ. The remaining portion of the conductive mask pattern 200 may function as an upper electrode TE. The lower electrode BE, the magnetic tunnel junction pattern MTJ, and the upper electrode TE may constitute the data storage pattern DS.

An upper portion of the lower insulating layer 110 on the cell region CR may be recessed by the ion beam etching process. Thus, side surfaces of the uppermost interconnection lines 104 on the cell region CR may be exposed. The top surface 110UC of the lower insulating layer 110 on the cell region CR may be located at a lower height than the top surfaces 104U of the uppermost interconnection lines 104 on the cell region CR and may be located at a lower height than the top surface 110UP of the lower insulating layer 110 on the peripheral region PR. Since the upper portion of the lower insulating layer 110 on the cell region CR is recessed by the ion beam etching process, the side surface 110S of the lower insulating layer 110 on the peripheral region PR may be exposed.

In the ion beam etching process, the magnetic tunnel junction layer MTJL and the lower electrode layer BEL on the peripheral region PR may be removed, and the peripheral mask pattern 140 may be removed. The peripheral mask pattern 140 may include a material having a low etch rate in the ion beam etching process and may include, e.g., a metal nitride (e.g., TiN). An etch rate of the peripheral mask pattern 140 may be relatively low in the ion beam etching process, and thus the first upper insulating layer 130 on the peripheral region PR may not be removed by the ion beam etching process but may remain.

The first boundary spacer SP1 may be formed in the ion beam etching process. A portion of at least one of the lower electrode layer BEL or the magnetic tunnel junction layer MTJL may not be removed by the ion beam etching process but may remain on the side surface 130S of the first upper insulating layer 130, the side surface 120S of the etch stop layer 120, and the side surface 110S of the lower insulating layer 110 on the peripheral region PR to define the first boundary spacer SP1. Thus, the first boundary spacer SP1 may be formed on the side surface 130S of the first upper insulating layer 130, the side surface 120S of the etch stop layer 120, and the side surface 110S of the lower insulating layer 110 on the peripheral region PR. The first boundary spacer SP1 may extend in the first direction D1 to cover the side surface 130S of the first upper insulating layer 130, the side surface 120S of the etch stop layer 120, and the side surface 110S of the lower insulating layer 110 on the peripheral region PR. A bottommost surface of the first boundary spacer SP1 may be in contact with the top surface 110UC of the lower insulating layer 110 on the cell region CR.

The first boundary spacer SP1 may include the same material as at least one of the lower electrode BE or the magnetic tunnel junction pattern MTJ. The first boundary spacer SP1 may include the same element as an element of at least one of the lower electrode BE or the magnetic tunnel junction pattern MTJ. The first boundary spacer SP1 may include a conductive material.

An insulating spacer layer 150L may be, e.g., conformally, formed on the cell region CR and the peripheral region PR of the substrate 100. The insulating spacer layer 150L (e.g., with a substantially uniform thickness) may conformally cover a top surface and a side surface of the data storage pattern DS and the exposed side surfaces of the uppermost interconnection lines 104 on the cell region CR and may extend along the top surface 110UC of the lower insulating layer 110 on the cell region CR. The insulating spacer layer 150L may cover the first boundary spacer SP1 and may extend onto a top surface of the first upper insulating layer 130 on the peripheral region PR. The first boundary spacer SP1 may be disposed between the side surface 130S of the first upper insulating layer 130 on the peripheral region PR and the insulating spacer layer 150L, between the side surface 120S of the etch stop layer 120 on the peripheral region PR and the insulating spacer layer 150L, and between the side surface 110S of the lower insulating layer 110 on the peripheral region PR and the insulating spacer layer 150L.

Figure 9:
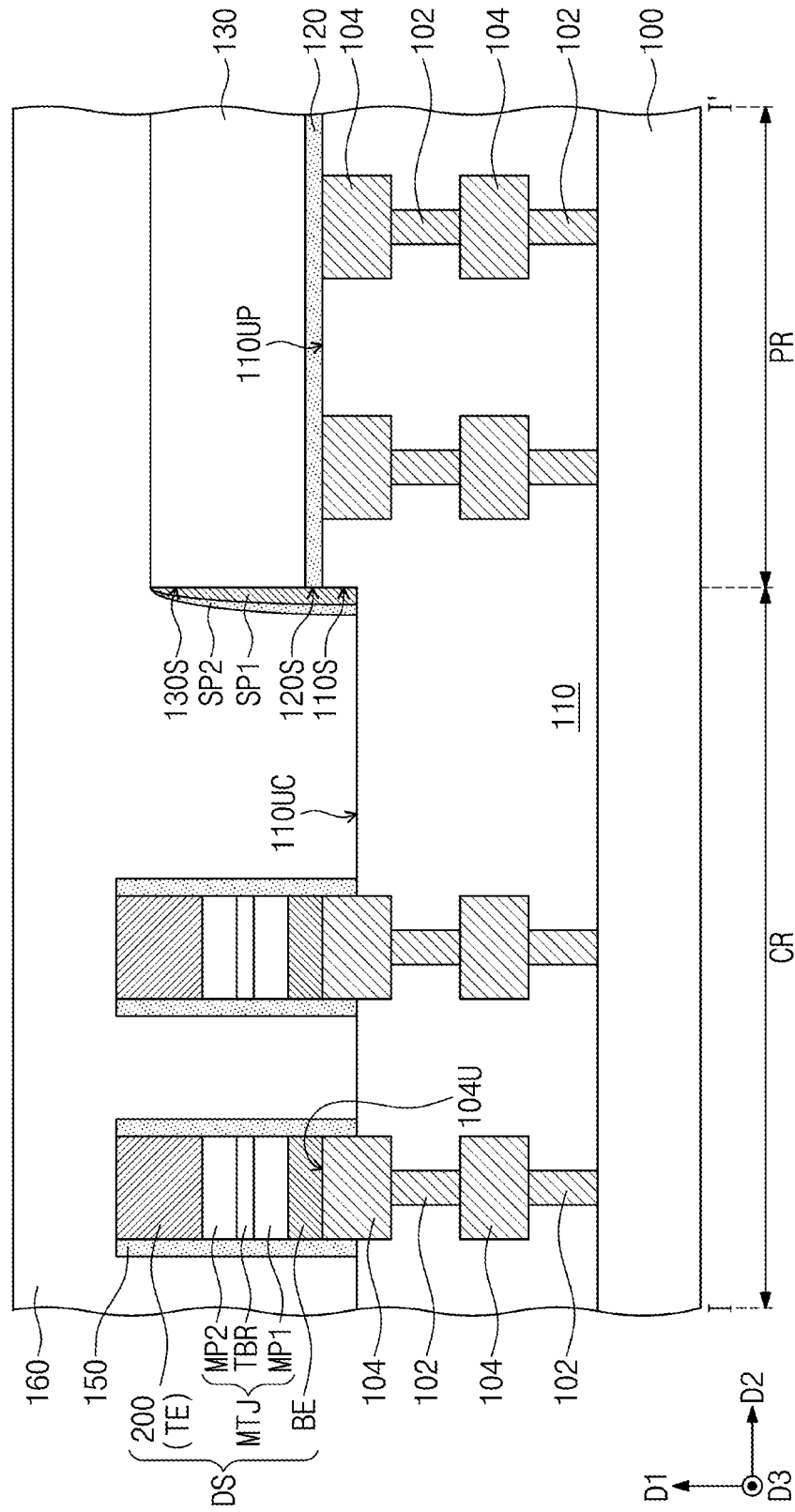

Referring to FIG. 9, the insulating spacer layer 150L may be anisotropically etched to form the insulating spacer 150 on the side surface of the data storage pattern DS. The insulating spacer 150 may surround the side surface of the data storage pattern DS when viewed in a plan view. The insulating spacer 150 may extend onto the exposed side surface of a corresponding uppermost interconnection line 104 of the uppermost interconnection lines 104 on the cell region CR. The insulating spacer 150 may cover the exposed side surface of the corresponding uppermost interconnection line 104, and a bottommost surface of the insulating spacer 150 may be in contact with the top surface 110UC of the lower insulating layer 110 on the cell region CR.

Since the insulating spacer layer 150L is anisotropically etched, a second boundary spacer SP2 may be formed on a side surface of the first boundary spacer SP1. A portion of the insulating spacer layer 150L may not be etched by the anisotropic etching process but may remain on the side surface 130S of the first upper insulating layer 130, the side surface 120S of the etch stop layer 120, and the side surface 110S of the lower insulating layer 110 on the peripheral region PR, and thus the second boundary spacer SP2 may be formed on the side surface 130S of the first upper insulating layer 130, the side surface 120S of the etch stop layer 120, and the side surface 110S of the lower insulating layer 110 on the peripheral region PR. The first boundary spacer SP1 may be disposed between the side surface 130S of the first upper insulating layer 130 on the peripheral region PR and the second boundary spacer SP2, between the side surface 120S of the etch stop layer 120 on the peripheral region PR and the second boundary spacer SP2, and between the side surface 110S of the lower insulating layer 110 on the peripheral region PR and the second boundary spacer SP2. In certain embodiments, the insulating spacer layer 150L may be removed on the side surface 130S of the first upper insulating layer 130, the side surface 120S of the etch stop layer 120, and the side surface 110S of the lower insulating layer 110 on the peripheral region PR during the anisotropic etching process, and in this case, the second boundary spacer SP2 may not be formed.

The second upper insulating layer 160 may be formed on the cell region CR and the peripheral region PR of the substrate 100. The second upper insulating layer 160 may cover the data storage pattern DS and may cover the top surface 110UC of the lower insulating layer 110 on the cell region CR. The insulating spacer 150 may be disposed between the side surface of the data storage pattern DS and the second upper insulating layer 160, and may be disposed between the exposed side surface of a corresponding uppermost interconnection line 104 of the uppermost interconnection lines 104 and the second upper insulating layer 160. The second upper insulating layer 160 may cover the first and second boundary spacers SP1 and SP2, and may extend onto the top surface of the first upper insulating layer 130 on the peripheral region PR. The first and second boundary spacers SP1 and SP2 may be disposed between the side surface 130S of the first upper insulating layer 130 on the peripheral region PR and the second upper insulating layer 160, between the side surface 120S of the etch stop layer 120 on the peripheral region PR and the second upper insulating layer 160, and between the side surface 110S of the lower insulating layer 110 on the peripheral region PR and the second upper insulating layer 160.

Referring again to FIGS. 2 and 3, the cell conductive lines 170C may be formed on the cell region CR of the substrate 100 and in the second upper insulating layer 160. For example, the cell conductive lines 170C may be spaced apart from each other in the second direction D2 and may extend in the third direction D3. The data storage pattern DS may be connected to a corresponding cell conductive line 170C of the cell conductive lines 170C.

Peripheral conductive lines 170P may be formed on the peripheral region PR of the substrate 100 and in the second upper insulating layer 160. For example, the peripheral conductive lines 170P may be spaced apart from each other in the second direction D2 and may extend in the third direction D3. Peripheral contacts 175 may be formed under each of the peripheral conductive lines 170P. The peripheral contacts 175 may be spaced apart from each other in the third direction D3 under each of the peripheral conductive lines 170P and may be connected to each of the peripheral conductive lines 170P. Each of the peripheral contacts 175 may penetrate the second upper insulating layer 160, the first upper insulating layer 130, and the etch stop layer 120 on the peripheral region PR, and may be connected (i.e., electrically connected) to a corresponding one of the uppermost interconnection lines 104 on the peripheral region PR.

For example, the formation of the cell conductive lines 170C, the peripheral conductive lines 170P, and the peripheral contacts 175 may include forming cell trenches in the second upper insulating layer 160 on the cell region CR, forming peripheral trenches in the second upper insulating layer 160 on the peripheral region PR, forming peripheral contact holes extending from a bottom surface of each of the peripheral trenches toward the substrate 100, forming a conductive layer filling the cell trenches, the peripheral trenches, and the peripheral contact holes on the second upper insulating layer 160, and planarizing the conductive layer to expose a top surface of the second upper insulating layer 160.

By way of summation and review, embodiments provide a semiconductor device and a method of manufacturing the same, which are capable of simplifying manufacturing processes. Embodiments also provide a semiconductor device capable of being easily manufactured and a method of manufacturing the same.

That is, according to embodiments, the plurality of data storage patterns on the cell region may be connected directly to the top surfaces of the uppermost interconnection lines. In other words, additional contact plugs for electrical connection between the plurality of data storage patterns and the uppermost interconnection lines may not be required, and thus a manufacturing process for forming the additional contact plugs may not be required. As a result, the number of processes for manufacturing the semiconductor device may be reduced. In addition, since the additional contact plugs are not formed between the plurality of data storage patterns and the uppermost interconnection lines, the vertical lengths of the peripheral contacts on the peripheral region may be reduced. Accordingly, the aspect ratio of the peripheral contacts may be reduced, and thus the peripheral contacts may be easily formed. As a result, it is possible to provide a semiconductor device via simplified manufacturing processes.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor device, comprising:
a substrate including a cell region and a peripheral region;
interconnection lines on the cell region and the peripheral region, the interconnection lines being spaced apart from the substrate in a first direction perpendicular to a top surface of the substrate;
a lower insulating layer on the cell region and the peripheral region, the lower insulating layer covering the interconnection lines, and a top surface of the lower insulating layer on the cell region being at a lower height than top surfaces of uppermost interconnection lines of the interconnection lines, wherein the uppermost interconnection lines protrude beyond the top surface of the lower insulating layer on the cell region;
data storage patterns on the lower insulating layer on the cell region, the data storage patterns being horizontally spaced apart from each other, and the data storage patterns being connected directly to the top surfaces of the uppermost interconnection lines on the cell region; and
an insulating spacer covering a side surface of each of the data storage patterns,
wherein the lower insulating layer on the cell region exposes side surfaces of the uppermost interconnection lines on the cell region, and
wherein the insulating spacer is adjacent to a corresponding one of the exposed side surfaces of the uppermost interconnection lines on the cell region.

2. The semiconductor device as claimed in claim 1,
wherein the top surface of the lower insulating layer on the cell region is at a lower height than a top surface of the lower insulating layer on the peripheral region.

3. The semiconductor device as claimed in claim 1, further comprising:
an etch stop layer and a first upper insulating layer, which are sequentially stacked on the lower insulating layer on the peripheral region; and
a second upper insulating layer on the lower insulating layer on the cell region and covering the data storage patterns,
wherein the insulating spacer is between the side surface of each of the data storage patterns and the second upper insulating layer, and between the corresponding one of the exposed side surfaces of the uppermost interconnection lines and the second upper insulating layer.

4. The semiconductor device as claimed in claim 3,
wherein the second upper insulating layer is in contact with the top surface of the lower insulating layer on the cell region and extends onto the first upper insulating layer on the peripheral region.

5. The semiconductor device as claimed in claim 1, further comprising:
a second upper insulating layer on the lower insulating layer on the cell region and covering the data storage patterns;
an etch stop layer and a first upper insulating layer, which are sequentially stacked on the lower insulating layer on the peripheral region; and
a first boundary spacer having a first side surface that is adjacent to a side surface of the first upper insulating layer and a side surface of the etch stop layer and a second side surface that is adjacent to the second upper insulating layer,
wherein the first boundary spacer includes a conductive material.

6. The semiconductor device as claimed in claim 5,
wherein the first boundary spacer contacts the side surface of the etch stop layer.

7. The semiconductor device as claimed in claim 5,
wherein the first boundary spacer has a line shape extending in a direction parallel to the top surface of the substrate when viewed in a plan view.

8. The semiconductor device as claimed in claim 5,
wherein:
each of the data storage patterns includes a lower electrode, a magnetic tunnel junction pattern, and an upper electrode, which are sequentially stacked on the top surface of a corresponding one of the uppermost interconnection lines on the cell region, and
the first boundary spacer includes a same element as at least one of the lower electrode and the magnetic tunnel junction pattern.

9. The semiconductor device as claimed in claim 5,
wherein:
each of the data storage patterns includes a lower electrode, a magnetic tunnel junction pattern, and an upper electrode, which are sequentially stacked on the top surface of a corresponding one of the uppermost interconnection lines on the cell region, and
the first boundary spacer includes a same material as at least one of the lower electrode and the magnetic tunnel junction pattern.

10. The semiconductor device as claimed in claim 5,
wherein the second upper insulating layer covers the first boundary spacer and extends onto the first upper insulating layer on the peripheral region.

11. The semiconductor device as claimed in claim 10,
wherein the first boundary spacer contacts the side surface of the first upper insulating layer and the second upper insulating layer.

12. The semiconductor device as claimed in claim 11,
wherein the second upper insulating layer is in contact with the top surface of the lower insulating layer on the cell region.

13. The semiconductor device as claimed in claim 1, further comprising:
an etch stop layer and a first upper insulating layer, which are sequentially stacked on the lower insulating layer on the peripheral region;
cell conductive lines on the cell region and the data storage patterns, the cell conductive lines being connected to the data storage patterns;
peripheral conductive lines on the peripheral region and on the first upper insulating layer; and
peripheral contacts on the peripheral region and penetrating the etch stop layer and the first upper insulating layer, each of the peripheral contacts being connected to a bottom surface of a corresponding one of the peripheral conductive lines and is connected to a corresponding one of the uppermost interconnection lines on the peripheral region.

14. The semiconductor device as claimed in claim 13,
wherein the etch stop layer includes a material different from that of the first upper insulating layer.

15. A semiconductor device, comprising:
a substrate including a cell region and a peripheral region;
interconnection lines on the cell region and the peripheral region, the interconnection lines being spaced apart from a top surface of the substrate in a first direction perpendicular to the top surface of the substrate;
a lower insulating layer on the cell region and the peripheral region, the lower insulating layer covering the interconnection lines, and a top surface of the lower insulating layer on the cell region being at a lower height than a top surface of the lower insulating layer on the peripheral region;
data storage patterns on the lower insulating layer on the cell region, the data storage patterns being horizontally spaced apart from each other;
an etch stop layer and a first upper insulating layer which are sequentially stacked on the lower insulating layer on the peripheral region, the data storage patterns being horizontally spaced apart from a side surfaces of the etch stop layer and a side surface of the first upper insulating layer;
a second upper insulating layer on the lower insulating layer on the cell region and covering the data storage patterns; and
a first boundary spacer having a first side surface that is adjacent to at least one of the side surface of the etch stop layer and the side surface of the first upper insulating layer and a second side surface that is adjacent to the second upper insulating layer.

16. The semiconductor device as claimed in claim 15,
wherein the data storage patterns are connected directly to top surfaces of uppermost interconnection lines of the interconnection lines on the cell region.

17. The semiconductor device as claimed in claim 16,
wherein:
each of the data storage patterns includes a lower electrode, a magnetic tunnel junction pattern, and an upper electrode, which are sequentially stacked on the top surface of a corresponding uppermost interconnection line of the uppermost interconnection lines on the cell region, and the lower electrode is in contact with the top surface of the corresponding uppermost interconnection line.

18. The semiconductor device as claimed in claim 15, wherein each of the data storage patterns includes a lower electrode, a magnetic tunnel junction pattern, and an upper electrode, which are sequentially stacked in the first direction, and wherein the first boundary spacer includes a same material as at least one of the lower electrode and the magnetic tunnel junction pattern.

* * * * *